United States Patent [19]

Lyon et al.

[11] Patent Number: 5,212,152

[45] Date of Patent: May 18, 1993

[54] PROTECTION OF OXIDE SUPERCONDUCTORS FROM DEGRADATION

[75] Inventors: Stuart B. Lyon, Cheetham Hill; Beverley J. Hepburn, Chorlton-cum-Hardy, both of England

[73] Assignee: British Technology Group Limited, London, England

[21] Appl. No.: 743,399

[22] PCT Filed: Feb. 16, 1990

[86] PCT No.: PCT/GB90/00256

§ 371 Date: Aug. 16, 1991

§ 102(e) Date: Aug. 16, 1991

[87] PCT Pub. No.: WO90/09683

PCT Pub. Date: Aug. 23, 1990

[30] Foreign Application Priority Data

Feb. 18, 1989 [GB] United Kingdom ............... 8903731

[51] Int. Cl.$^5$ ........................... B05D 5/12; B05D 1/18
[52] U.S. Cl. ........................................ 505/1; 505/701; 427/62; 427/443.2
[58] Field of Search ................. 505/1, 725, 701, 778, 505/780, 782, 783; 427/62, 63, 443.2

[56] References Cited

FOREIGN PATENT DOCUMENTS 298866 1/1989 European Pat. Off. .

OTHER PUBLICATIONS

Vasquez et al, "Wet chemical techniques for passivation of $YBa_2Cu_3O_{7-x}$", Appl. Phys. Lett. 55(117) Oct. 1989, p. 1801–1803.

Osteryoung, et al., Electrochemical Formation of Polypyrrole Films on $YBa_2Cu_3O_7-x$, Journal of the Electrochemical Society, Oct. 1988, vol. 135, No. 10, see the whole document.

Primary Examiner—Shrive Beck
Assistant Examiner—Roy V. King
Attorney, Agent, or Firm—Cushman, Darby & Cushman

[57] ABSTRACT

A method of treating an oxide superconductor to prevent degradation thereof comprises treating the superconductor with a solution of a metal which is capable of being oxidized by the superconductor to form on those regions of the surface area of the superconductor treated with the solution an insulating, non-porous protective film of an oxide which is stable against further oxidation.

16 Claims, No Drawings

PROTECTION OF OXIDE SUPERCONDUCTORS FROM DEGRADATION

The present invention relates to the protection of oxide superconductors from degradation.

BACKGROUND OF THE INVENTION

The recently discovered oxide superconducting ceramic materials, with superconducting transition temperatures ($T_c$) in the range above that of liquid nitrogen (77° K), are technologically very exciting materials. However, they are not known to suffer extensive chemical degradation in the atmosphere, particularly in the presence of water vapour and carbon dioxide. In addition, they are highly oxidising and are able to oxidise metals, including gold, in bulk solution and in condensed moisture films. This reactivity will limit their eventual use and methods of eliminating the degradation must be sought prior to commercial exploitation.

It is therefore an object of the present invention to provide a method of protecting such superconductors from degradation.

SUMMARY OF THE INVENTION

According to the present invention there is provided a method of treating an oxide superconductor to prevent degradation thereof the method comprising treating the superconductor with a solution of a metal which is capable of being oxidised by the superconductor to form on those regions of the surface area of the superconductor treated with the solution an insulating, non-porous protective film of an oxide which is stable against further oxidation.

The invention also provides an oxide superconductor in which at least a portion of the surface area of the superconductor is coated with an insulating, non-porous protective film of a metal oxide which is stable against further oxidation by the superconductor.

DESCRIPTION OF THE PREFERRED EMBODIMENTS

The invention is applicable particularly to the treatment of copper-containing superconducting oxides. All oxide superconductors containing copper and/or an oxidised cuprate peroxide complex will be subject to degradation as described above and will therefore be suitable for treatment. Classes of copper containing superconductors to which the invention is applicable are given in Table I, together with specific examples of each class.

TABLE 1

| Classes of super conductor | Examples |
|---|---|
| La—Ba—Cu—O | $La_{1.8} Sr_{0.2} CuO_{4-x}$ |
| Y—Ba—U—O | $Y Ba_2 Cu_3O_{7-x}$ |
| (Pb) Bi—Sr—Ca—Cu—O | $Bi_2Sr_{3-x}Ca_x Cu_2O_{8-x}$ |
| Tl—Ba—Ca—Cu—O | $Tl_2Ba_2CaCu_3O_{10-x}$ |

In addition rare earth, and other, elements may dope the above.

It has been found that the provision of the metal oxide film acts as an effective barrier to protect the superconductor from corrosion and environmental degradation. The oxide film is so effective that untreated superconductors which would normally be attacked and quickly destroyed by atmospheric moisture are (when treated in accordance with the invention) totally stable when exposed to the atmosphere.

The method of the invention can most conveniently be effected by dipping the superconductor into the solution of the metal ions which give rise to the protective oxide film and simultaneously applying an appropriate oxidising electrochemical potential. For superconductors which have a degree of porosity, the solution will penetrate the interstices within the superconductor so that the protective metal oxide is deposited on the interior surface area.

The metal ion in the treatment solution must be one which can be oxidised on the superconductor surface to give an oxide film which is stable against oxidation by the highly oxidising superconductor. Suitable metal ions include $Mn^{2+}$, $Ti^{3+}$, $Pb^{2+}$ and $Sn^{2+}$.

In the case where the metal ion in an aqueous treatment solution is $Mn^{2+}$ and the superconductor contains $Cu^{3+}$ ions, the reaction process is essentially $$Mn^{2+} + 2H_2O = MnO_2 + 4H^+ + 2e^-$$

In the above example, the oxidation of $Mn^{2+}$ to $MnO_2$ may also be effected by an appropriate applied external potential (voltage).

The preferred concentration of the metal ion will depend on the particular metal, and the preferred ranges for $Mn^{2+}$, $Ti^{3+}$, $Pb^{2+}$ and $Sn^2$ are given in Table 2 below which also includes the preferred (acidic) pH of the medium.

TABLE 2

| Ion | Concentration | pH |
|---|---|---|
| $Mn^{2+}$ | 0.01 to 0.5M | <5 |
| $Ti^{3+}$ | $10^{-3}$ to 0.1M | <2 |
| $Pb^{2+}$ | 0.01 to 0.05M | <6 |
| $Sn^{2+}$ | $10^{-3}$ to 0.01M | <1 |

In all cases the metal ion may be used in aqueous solution or a low water activity solvent (e.g. acetic acid). Preferably the solution is a buffered solution, and preferably a potential of >0.8 V (referred to the Standard Hydrogen Scale) is applied.

Preferred treatment solutions are equimolar Mn acetate and acetic acid (pH ca 4 to 5), equimolar Pb acetate and acetic acid (pH ca 4 to 5), or solutions of $SnCl_2$ or $TiCl_3$ within the respective molarity ranges given above acidified by HCl to the given pH range. Preferred electrochemical potentials are E<0.8 V S H E (most superconductors in the solutions described will take up this potential naturally).

The time for which the superconductor is treated with the treatment solution will generally be in the range 1 to 10 minutes.

Most preferably the treatment is effected to produce an oxide film with a thickness in the range 1–10 μm.

We claim:

1. A method of treating an oxide superconductor to prevent degradation thereof characterized in that it comprises dipping the superconductor in a solution of metal ions, selected from the group consisting of $Mn^{2+}$, $Ti^{3+}$, $Pb^{2+}$ and $Sn^{2+}$, having a pH of less than 6 and simultaneously applying an external potential to form on those regions of the surface area of the superconductor treated with the solution an insulating, non-porous protective film of an oxide which is stable against further oxidation.

2. A method of treating an oxide superconductor to prevent degradation thereof as claimed in claim 1 characterized in that it comprises dipping the superconductor into a solution of metal ions which give rise to a protective oxide film and simultaneously applying an oxidizing electrochemical potential.

3. A method of treating an oxide superconductor to prevent degradation thereof as claimed in claim 1 characterised in that the metal ions are $Mn^{2+}$ in a solution of concentration 0.01 to 0.5M.

4. A method of treating an oxide superconductor to prevent degradation thereof as claimed in claim 3 characterised in that the pH of the solution is <5.

5. A method of treating an oxide superconductor to prevent degradation thereof as claimed in claim 3 characterised in that the treatment solution is equimolar Mn acetate and acetic acid.

6. A method of treating an oxide superconductor to prevent degradation thereof as claimed in claim 1 characterised in that the metal ions are $Pb^{2+}$ in a solution of concentration 0.01 to 0.05M.

7. A method of treating an oxide superconductor to prevent degradation thereof as claimed in claim 3 characterised in that the treatment solution is equimolar Pb acetate and acetic acid.

8. A method of treating an oxide superconductor to prevent degradation thereof as claimed in claim 1 characterised in that the metal ions are $Sn^{2+}$ in a solution of concentration $10^{-3}$ to 0.01M.

9. A method of treating an oxide superconductor to prevent degradation thereof as claimed in claim 8 characterised in that the pH of the solution is <1.

10. A method of treating an oxide superconductor to prevent degradation thereof as claimed in claim 9 characterised in that the treatment solution is $SnCl_2$ and hydrochloric acid.

11. A method of treating an oxide superconductor to prevent degradation thereof as claimed in claim 1 characterised in that the metal ions are $Ti^{3+}$ in a solution of concentration $10^{-3}$ to 0.1M.

12. A method of treating an oxide superconductor to prevent degradation thereof as claimed in claim 11 and the pH of the solution is <2.

13. A method of treating an oxide superconductor to prevent degradation thereof as claimed in claim 9 characterised in that the treatment solution is $TiCl_3$ and hydrochloric acid.

14. A method of treating an oxide superconductor to prevent degradation thereof characterized in that it comprises dipping the superconductor in a solution of metal ions, selected from the group consisting of $Mn^{2+}$, $Ti^{3+}$, $Pb^{2+}$ and $Sn^{2+}$, having a pH of less than 6 and simultaneously applying an external voltage to oxidize said metal.

15. A method of treating an oxide superconductor to prevent degradation thereof as claimed in claim 14 characterised in that a potential of >0.8 V (referred to the Standard Hydrogen Scale) is applied.

16. A method of treating an oxide superconductor to prevent degradation thereof as claimed in any one of the preceding claims characterised in that the time for which the superconductor is treated with the treatment solution is in the range 1 to 10 minutes.

* * * * *